(12) United States Patent
Chen et al.

(10) Patent No.: US 8,231,188 B1
(45) Date of Patent: Jul. 31, 2012

(54) SUPPORT MECHANISM FOR SLIDE ASSEMBLY

(75) Inventors: Ken-Ching Chen, Kaohsiung (TW);
Wei-Cheng Chang, Kaohsiung (TW);
Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 13/183,505

(22) Filed: Jul. 15, 2011

(51) Int. Cl.
*A47B 95/00* (2006.01)
*A47B 88/00* (2006.01)

(52) U.S. Cl. .............. 312/333; 312/334.47; 312/334.4

(58) Field of Classification Search .............. 312/333, 312/334.44, 334.46, 334.47, 334.4, 334.5, 312/332.1; 248/298.1, 27.1, 316.8; 211/126.15, 211/26
See application file for complete search history.

(56) References Cited

U.S. PATENT DOCUMENTS

| | | | |
|---|---|---|---|
| 3,104,142 A * | 9/1963 | Geren et al. | 312/333 |
| 4,423,914 A * | 1/1984 | Vander Ley | 312/333 |
| 4,749,242 A * | 6/1988 | Rechberg | 312/333 |
| 6,773,080 B2 * | 8/2004 | Chen et al. | 312/265.1 |
| 2001/0003407 A1 * | 6/2001 | Fraccaro | 312/333 |
| 2003/0052580 A1 * | 3/2003 | Dobler et al. | 312/334.44 |
| 2005/0155941 A1 * | 7/2005 | Hartman et al. | 211/26 |
| 2009/0039746 A1 * | 2/2009 | Lam et al. | 312/334.1 |

* cited by examiner

*Primary Examiner* — Darnell Jayne
*Assistant Examiner* — Andrew Roersma
(74) *Attorney, Agent, or Firm* — Rosenberg, Klein & Lee

(57) ABSTRACT

A slide assembly includes a first rail, a second rail, an engaging member and a resilient member. The first rail includes an extension wall and the second rail is slidably connected to the first rail, and has a passage. The engaging member is pivotably connected to the second rail, and has a first end and a second end. The first end includes a stop. The resilient member is connected between the second end of the engaging member and the second rail so as to provide a resilient force to the engaging member so that the stop of the first end of the engaging member is inserted into the passage of the second rail by the resilient force from the resilient member. The stop is longitudinally located corresponding to the extension wall of the first rail. When the second rail is slid to a pre-set position relative to the first rail, the stop of the engaging member contacts the extension wall of the first rail to form a stop point.

2 Claims, 5 Drawing Sheets

SUPPORT MECHANISM FOR SLIDE ASSEMBLY

FIELD OF THE INVENTION

The present invention relates to a support mechanism for a slide assembly, and more particularly, to a support mechanism which prevents the rails from disengaging from the slide assembly when the rails are extended.

BACKGROUND OF THE INVENTION

U.S. Pat. No. 6,547,081 to Kaminski discloses a "slide assembly for use in a rack assembly" which is used for a high load capacity, low profile, low friction slide assembly for use in a rack assembly. In one embodiment, the slide assembly comprises a first longitudinal member having a central portion, a first upwardly extending portion on one side and a second upwardly extending portion on the other side and a second longitudinal member having a central portion, a first downwardly extending portion on one side and a second downwardly extending portion on the other side. The second longitudinal member is slidably engaged with the first longitudinal member such that the second longitudinal member can slide lengthwise with respect to the first longitudinal member. The first downwardly extending portion engages the first longitudinal member proximate the juncture between the first upwardly extending portion and the central portion of the first longitudinal member and the second downwardly extending portion engages the first longitudinal member proximate the juncture between the second upwardly extending portion and the central portion of the first longitudinal member.

The slide assembly does not disclose a drop-proof mechanism to prevent the rails from dropping when the slide assembly is fully extended.

SUMMARY OF THE INVENTION

The present invention intends to provide a support mechanism for a slide assembly and the support mechanism prevents the rails from dropping when the slide assembly is extended to a pre-set position, and the support mechanism establishes a stop point to avoid the dropping.

The present invention relates to a slide assembly and comprises a first rail having a vertical board, a top rail and a bottom rail, wherein the top rail extends toward a first direction from the top of the vertical board and bends downward. The top rail has a first horizontal section and a first vertical section which extends perpendicularly and downward from the first horizontal section. The vertical board, the first horizontal section and the first vertical section define a first path. The bottom rail extends toward a second direction from the underside of the vertical board and bends upward. The first and second directions are in opposite to each other. The bottom rail has a second horizontal section and a second vertical section which extends perpendicularly and upward from the second horizontal section. An end of the second vertical section forms an extension wall.

A second rail has a top board and two side walls extending downward from two sides of the top board. The top board and the side walls form a passage. The top board has an opening which communicates with the passage. One of the side walls has a pivotal plate. The second rail is connected to the second vertical section of the bottom rail of the first rail by the passage.

An engaging member is pivotably connected to the pivotal plate of the second rail and has a first end and a second end which is located in opposite to the first end. The first end has a stop located corresponding to the opening of the top board of the second rail and the stop enters into the passage via the opening, and is longitudinally located corresponding to the extension wall of the second vertical section of the first rail.

A resilient member is connected between the second end of the engaging member and the top board of the second rail. The resilient member provides a resilient force to the engaging member so that the stop of the first end of the engaging member is inserted into the passage of the second rail by the resilient force from the resilient member.

By the support mechanism of the present invention, when the second rail is slid to a pre-set position relative to the first rail, the stop of the engaging member contacts the extension wall of the first rail to form a stop point.

Preferably, the resilient member is fixed to the second end of the engaging member and has a resilient leg which contacts against the top board of the second rail.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
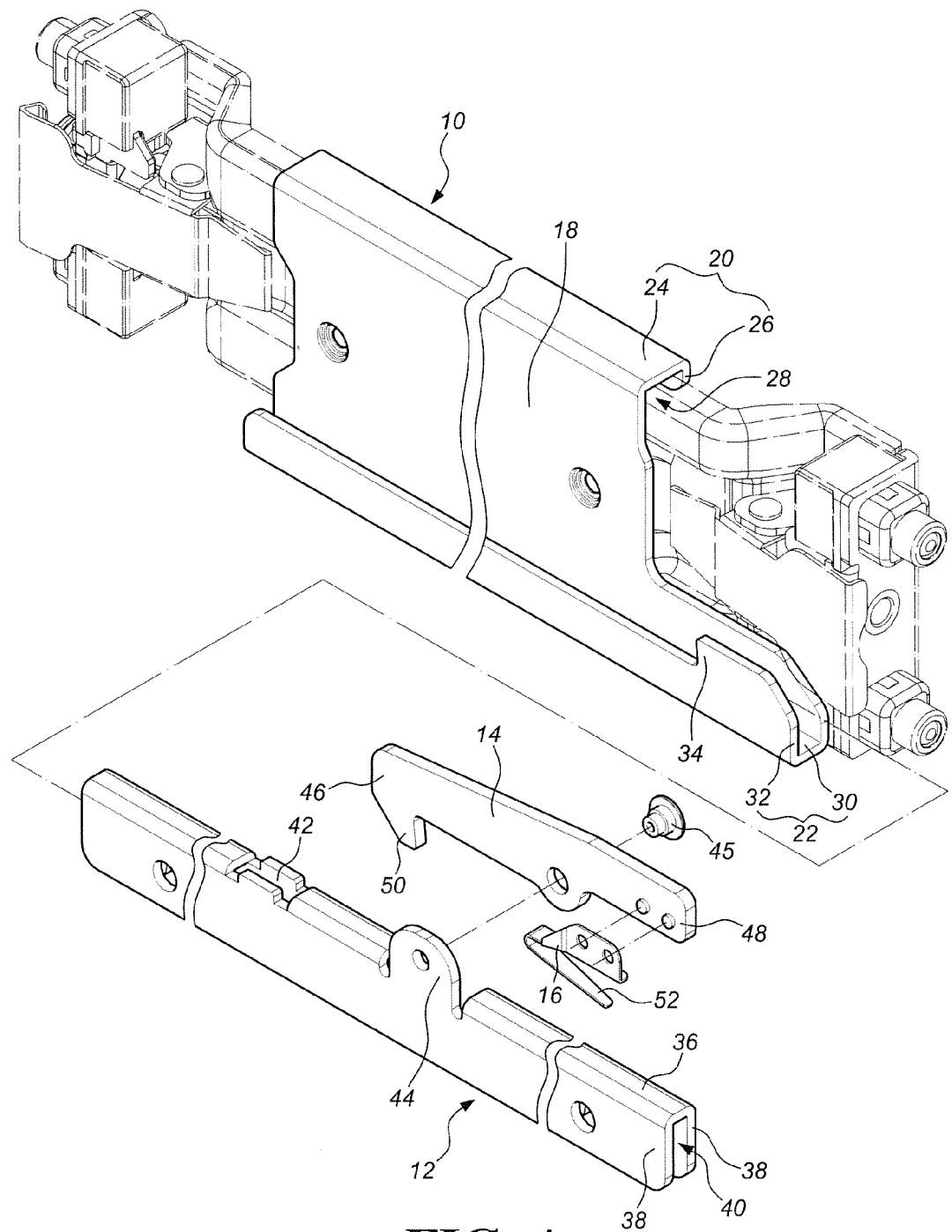
FIG. 1 is an exploded view to show the support mechanism for a slide assembly of the present invention.
Figure 2:
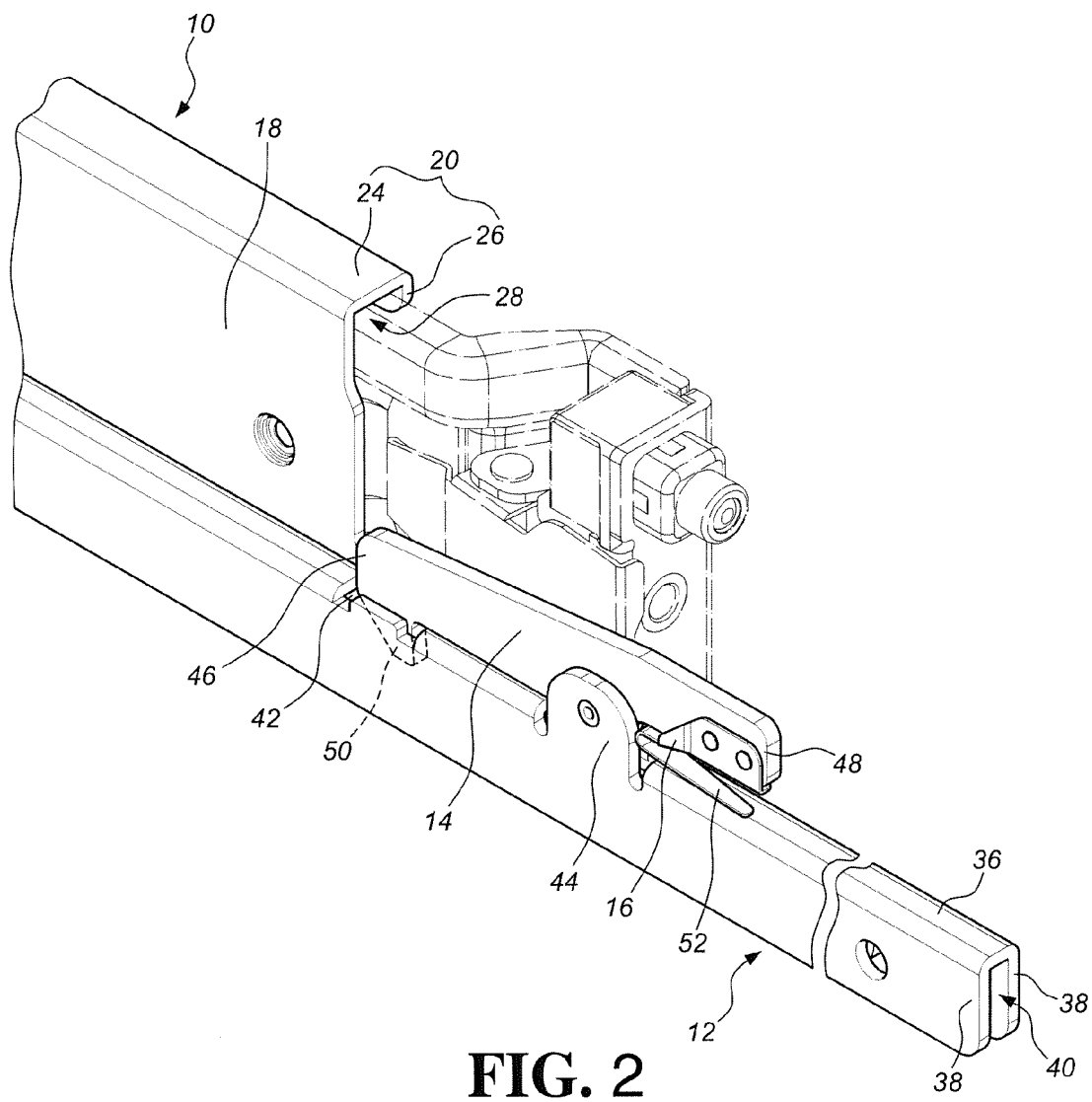
FIG. 2 is a perspective view to show the support mechanism for a slide assembly of the present invention.

Referring to FIGS. 1 and 2, the slide assembly of the present invention comprises a first rail 10, a second rail 12, an engaging member 14 and a resilient member 16.

The first rail 10 comprises a vertical board 18, a top rail 20 and a bottom rail 22. The top rail 20 extends toward a first direction from the top of the vertical board 18 and bends downward. The bottom rail 22 extends toward a second direction from the underside of the vertical board 18 and bends upward. The first and second directions are in opposite to each other. The top rail 20 has a first horizontal section 24 and a first vertical section 26 which extends perpendicularly and downward from the first horizontal section 24. The vertical board 18, the first horizontal section 24 and the first vertical section 26 define a first path 28. The bottom rail 22 has a second horizontal section 30 and a second vertical section 32 which extends perpendicularly and upward from the second horizontal section 30. The front end of the second vertical section 32 forms an extension wall 34.

The second rail 12 has a top board 36 and two side walls 38 which extend downward from two sides of the top board 36 so as to form an inverted U-shaped rail. The top board 36 and the side walls 38 define a passage 40. The top board 36 has an opening 42 which communicates with the passage 40. One of the side walls 38 has a pivotal plate 44 extending to a position above the top board 36. The pivotal plate 44 is located adjacent to the opening 42. The second rail 12 is connected to the second vertical section 32 of the bottom rail 22 of the first rail 10 by the passage 40.

The engaging member 14 is pivotably connected to the pivotal plate 44 of the second rail 12 by a pin 45 and has a first end 46 and a second end 48 which is located in opposite to the first end 46. The first end 46 has a stop 50 which is located corresponding to the opening 42 of the top board 36 of the second rail 12. The stop 50 enters into the passage 40 via the opening 42 and is longitudinally located corresponding to the extension wall 34 of the second vertical section 32 of the first rail 10.

The resilient member 16 is connected between the second end 48 of the engaging member 14 and the top board 36 of the second rail 12. The resilient member 16 provides a resilient force to the engaging member 14 so that the stop 50 of the first end 46 of the engaging member 14 is inserted into the passage 40 of the second rail 12 by the resilient force from the resilient member 16. Preferably, the resilient member 16 is fixed to the second end 48 of the engaging member 14 and has a resilient leg 52 which contacts against the top board 36 of the second rail 12.

Figure 3:
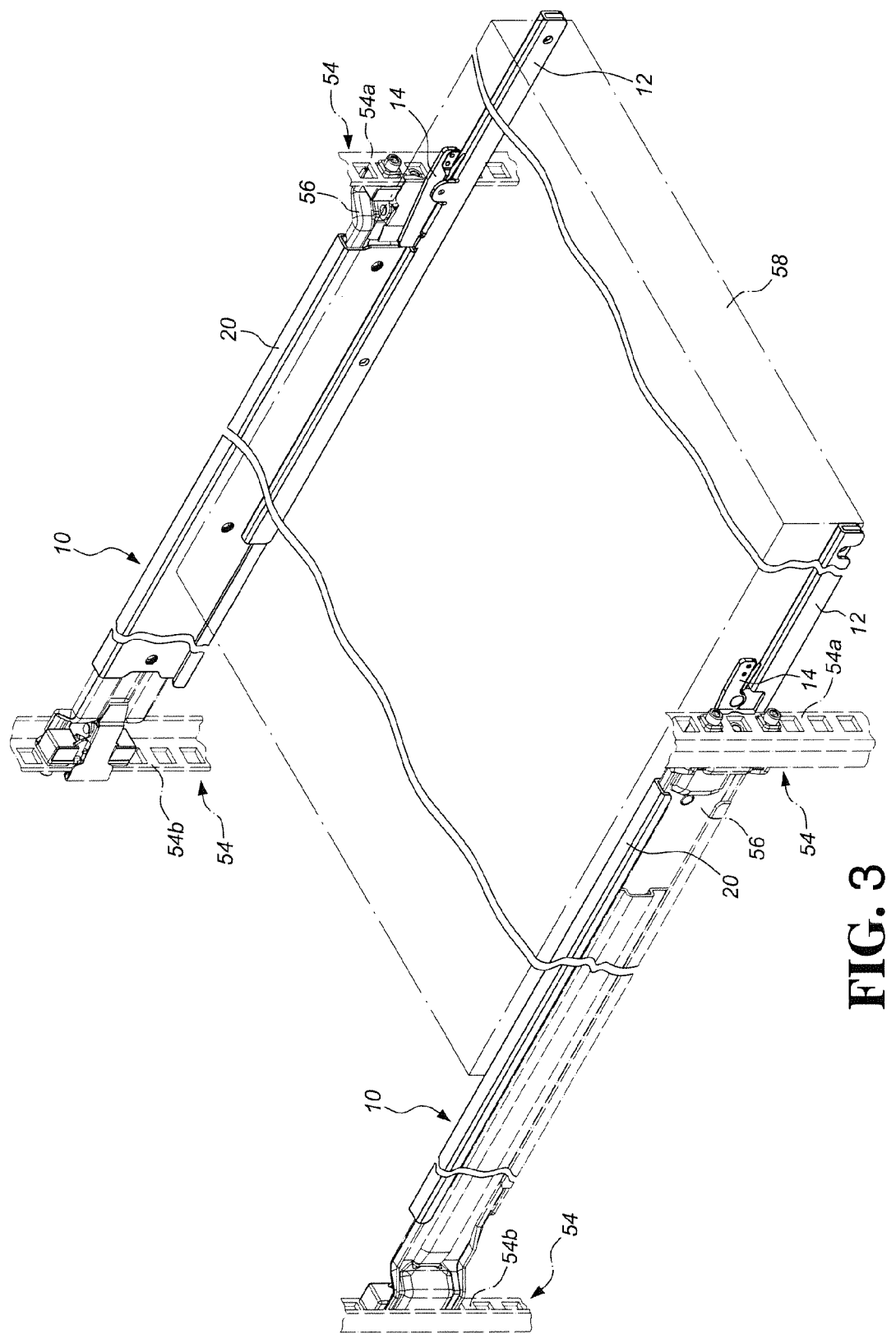
FIG. 3 shows the slide assembly is connected with a rack and a chassis.

FIG. 3 shows that the rack system is composed of four columns 54 and a support unit 56 located between the columns 54a, 54b on two sides of the rack system, and a chassis 58. In this embodiment, the support unit 56 is connected to the top rails 20 of the first rails 10 and the chassis 58 is then connected to the columns 54 by the support unit 56. The chassis 58 is connected across the columns 54 and can be pulled out or pushed in. The two sides of the chassis 58 are respectively connected to two second rails 12, and the chassis 58 and the second rails 12 are able to be pulled relative to the first rails 10. The engaging members 14 on the second rails 12 are located at the front columns 54a and exposed.

The chassis 58 is connected to the second vertical section 32 of the bottom rail 22 of the first rail 10 by the passage 40 of the second rail 12. The chassis 58 can be pulled out by the movement of the second rails 12 along the first rails 10.

Figure 4:
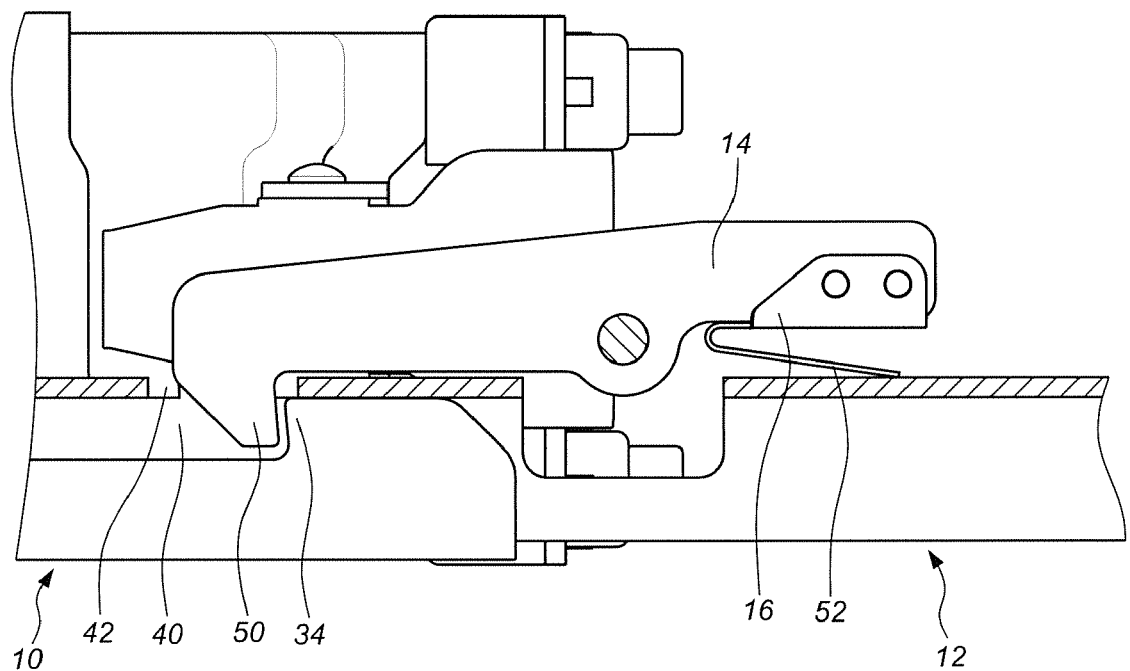
FIG. 4 shows that the slide assembly is pulled to a pre-set position.

When the chassis 58 is pulled to a pre-set position relative to the columns 54a, 54b as shown in FIG. 3, the stops 50 are inserted into the passages 40 of the second rails 12 via the openings 42, and by the resilient force from the resilient members 16, the stops 50 of the engaging members 14 on the second rails 12 contact the extension walls 34 of the first rail 10 to form a stop point, while the engaging members 14 are moved with the movement of the second rails 12 along the first rails 10 as shown in FIG. 4. The stop points prevent the chassis 58, as shown in FIG. 3, from dropping from the columns 54.

Figure 5:
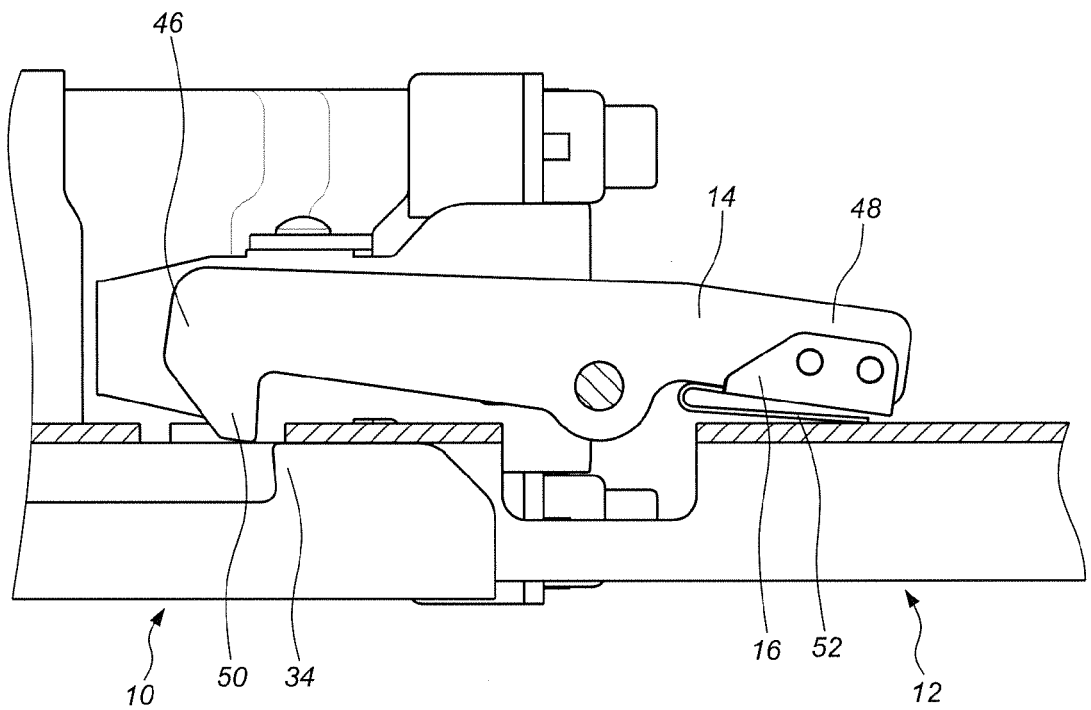
FIG. 5 shows the unlocking operation of the support mechanism for a slide assembly of the present invention.

When the chassis 58 as shown in FIG. 3 is further pulled or to be removed from the columns 54, as shown in FIG. 5, the users push the second ends 48 of the engaging members 14 to compress the resilient legs 52 of the resilient members 16 to disengage the stops 50 of the first ends 46 of the engaging members 14 from the extension walls 34 of the first rails 10. The action releases the stop points and the chassis 58 as shown in FIG. 3 can be further pulled out or disengaged from the columns 54.

While we have shown and described the embodiment in accordance with the present invention, it should be clear to those skilled in the art that further embodiments may be made without departing from the scope of the present invention.

What is claimed is:

1. A slide assembly comprising:

a first rail having a vertical board, a top rail and a bottom rail, the top rail extending toward a first direction from a top of the vertical board and bending downward, the top rail having a first horizontal section and a first vertical section which extends perpendicularly and downward from the first horizontal section, the vertical board, the first horizontal section and the first vertical section defining a first path, the bottom rail extending toward a second direction from an underside of the vertical board and bending upward, the first and second directions being in opposite to each other, the bottom rail having a second horizontal section and a second vertical section which extends perpendicularly and upward from the second horizontal section, an end of the second vertical section forming an extension wall;

a second rail having a top board and two side walls which extend downward from two sides of the top board, the top board and the side walls forming a passage, the top board having an opening which communicates with the passage, one of the side walls having a pivotal plate, the second rail being connected to the second vertical section of the bottom rail of the first rail by the passage;

an engaging member pivotably connected to the pivotal plate of the second rail and having a first end and a second end which is located in opposite to the first end, the first end having a stop which is located corresponding to the opening of the top board of the second rail, the stop entering into the passage via the opening and being longitudinally located corresponding to the extension wall of the second vertical section of the first rail, and a resilient member connected between the second end of the engaging member and the top board of the second rail, the resilient member providing a resilient force to the engaging member so that the stop of the first end of the engaging member is inserted into the passage of the second rail by the resilient force from the resilient member.

2. The slide assembly as claimed in claim 1, wherein the resilient member is fixed to the second end of the engaging member and has a resilient leg which contacts against the top board of the second rail.

\* \* \* \* \*